United States Patent
Tavakkoli Kermani Ghariehali

(10) Patent No.: US 11,281,095 B2
(45) Date of Patent: Mar. 22, 2022

(54) FRAME CURING TEMPLATE AND SYSTEM AND METHOD OF USING THE FRAME CURING TEMPLATE

(71) Applicant: CANON KABUSHIKI KAISHA, Tokyo (JP)

(72) Inventor: Amir Tavakkoli Kermani Ghariehali, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 388 days.

(21) Appl. No.: 16/210,620

(22) Filed: Dec. 5, 2018

(65) Prior Publication Data
US 2020/0183269 A1   Jun. 11, 2020

(51) Int. Cl.
| | | |
|---|---|---|
| *G03F 7/00* | (2006.01) | |
| *H01L 21/56* | (2006.01) | |
| *B29C 35/08* | (2006.01) | |
| *B29C 59/02* | (2006.01) | |
| *B82Y 40/00* | (2011.01) | |

(52) U.S. Cl.
CPC ........ *G03F 7/0002* (2013.01); *B29C 35/0805* (2013.01); *B29C 59/02* (2013.01); *G03F 7/0022* (2013.01); *H01L 21/565* (2013.01); *B29C 2035/0827* (2013.01); *B29C 2035/0833* (2013.01); *B82Y 40/00* (2013.01)

(58) Field of Classification Search
None
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,011,916 B2 | 9/2011 | Suehira et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,361,371 B2 | 1/2013 | Khusnatdinov et al. |
| 8,480,946 B2 | 6/2013 | Mikami et al. |

(Continued)

FOREIGN PATENT DOCUMENTS

JP   2018014483 A   1/2018

OTHER PUBLICATIONS

Niyaz Khusnatdinov et al., U.S. Appl. No. 15/837,898, filed Dec. 11, 2017.

(Continued)

*Primary Examiner* — Timothy Kennedy
(74) *Attorney, Agent, or Firm* — Daniel Ratoff

(57) ABSTRACT

A frame curing template for imprinting formable material on a substrate and a system and a method of using the frame curing template. The template may comprise: a patterning surface on a mesa on a front side of the template; a recessed surface surrounding the mesa on the front side of the template; a recessed surface coating on the recessed surface. A first transmittance from a back side of the template through the recessed surface coating to actinic radiation may be below a first threshold transmittance. A first frame window may be inset within the recessed surface coating and surrounds the mesa. A second transmittance of the template from the back side of the template through the first frame window to the actinic radiation may be above the first threshold transmittance.

14 Claims, 10 Drawing Sheets

(56) References Cited

U.S. PATENT DOCUMENTS

| | | | |
|---|---|---|---|
| 8,641,958 B2 | 2/2014 | Khusnatdinov et al. | |
| 8,946,093 B2 | 2/2015 | Mikami | |
| 2006/0266916 A1 | 11/2006 | Miller et al. | |
| 2007/0104813 A1* | 5/2007 | Wuister | G03F 7/0002 |
| | | | 425/174.4 |
| 2011/0068510 A1* | 3/2011 | Wuister | G03F 7/0002 |
| | | | 264/447 |
| 2013/0078821 A1 | 3/2013 | Furutono | |
| 2013/0234371 A1 | 9/2013 | Yamaguchi et al. | |
| 2015/0004275 A1 | 1/2015 | Miyajima et al. | |
| 2018/0004091 A1 | 1/2018 | Shinoda | |
| 2018/0299772 A1* | 10/2018 | Jung | G03F 7/0002 |

OTHER PUBLICATIONS

Amir Tavakkoli Kermani Ghariehali et al., U.S. Appl. No. 15/720,308, filed Sep. 29, 2017.

* cited by examiner

FRAME CURING TEMPLATE AND SYSTEM AND METHOD OF USING THE FRAME CURING TEMPLATE

BACKGROUND

Field of Art

The present disclosure relates to a template for imprinting, systems and methods of imprinting a pattern on a substrate with a template.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

At least a first embodiment, may be a template for imprinting formable material on a substrate. The template may comprise: a patterning surface on a mesa on a front side of the template; a recessed surface surrounding the mesa on the front side of the template; a recessed surface coating on the recessed surface. A first transmittance from a back side of the template through the recessed surface coating to actinic radiation may be below a first threshold transmittance. A first frame window may be inset within the recessed surface coating and surrounds the mesa. A second transmittance of the template from the back side of the template through the first frame window to the actinic radiation may be above the first threshold transmittance.

An aspect of the first embodiment, may further comprise a second frame window inset within the recessed surface coating and surrounds the first frame window. A third transmittance of the template from the front side of the template through the second frame window and into the template to the actinic radiation may be above the first threshold transmittance.

In an aspect of the first embodiment, a reflectance to the actinic radiation incident on the front side of the recessed surface coating may be above a second threshold reflectance.

In an aspect of the first embodiment, the recessed surface coating may be made of one of: a chromium thin film; the chromium thin film and a protective layer; an aluminum thin film; UV enhanced aluminum thin film; and a multilayer reflective film.

In an aspect of the first embodiment, the recessed surface coating may also cover a portion of the mesa sidewall.

In an aspect of the first embodiment, the actinic radiation may be UV.

An aspect of the first embodiment, may be an apparatus configured to imprint the formable material onto the substrate with the template may comprise: a template chuck configured to hold the template; a substrate chuck configured to hold the substrate; a positioning system configured to bring the patterning surface into contact with the formable material in the imprint field of the substrate; a first source configured to emit a frame like illumination pattern of the actinic radiation through a frame window in the template which does not pass through the patterning surface; and a second source configured to emit a curing dose of actinic radiation that passes through the patterning surface.

In an aspect of the first embodiment, the first source may be configured to emit a gelling dose of the actinic radiation.

In an aspect of the first embodiment, the first source may be configured to emit a curing dose of the actinic radiation.

In an aspect of the first embodiment, a radiation source may generate the actinic radiation emitted by both the first source and the second source.

In an aspect of the first embodiment, the second source and the first source may share one or more optical components for guiding both the frame like illumination pattern of the actinic radiation and the curing dose of the actinic radiation.

In an aspect of the first embodiment, the one or more optical components maybe configured to be in a first state and a second state. In a first case in which the one or more optical components are in the first state, the frame like illumination pattern of the actinic radiation may be: guided thru the template; guided thru the first frame window; and incident upon the formable material in a gap between the substrate and a perimeter region of the patterning surface. In a second case in which the one or more optical components are in the second state, the curing dose of the actinic radiation may be guided thru: the template and the patterning surface.

In an aspect of the first embodiment, the actinic radiation may pass through the frame window at angle that causes the actinic radiation to reach the formable material in a gap between the substrate and a perimeter region of the patterning surface.

In an aspect of the first embodiment, a first portion of the frame like illumination pattern that passes through the first window may be reflected by the substrate. A second portion of the first portion maybe reflected off the recessed surface coating. The frame window may be positioned relative to the mesa sidewall such that the second portion is incident on the formable material in a gap between the substrate and a perimeter region of the patterning surface.

In an aspect of the first embodiment, the frame window may be positioned relative to the mesa sidewall such that the frame like illumination pattern of actinic radiation is reflected more than once between the substrate and the recessed surface coating prior to being incident upon the formable material in the gap between the substrate and a perimeter region of the patterning surface.

In an aspect of the first embodiment, a third portion of the first portion that is reflected by the substrate may be transmitted through a first section of the recessed surface that does not include the recessed surface coating.

In an aspect of the first embodiment, the first section may be selected from a group consisting of: the frame window; and an outer frame window.

At least a second embodiment, may be a method of manufacturing an article with a template. The template may have a patterning surface on a mesa on a front side of the template, a recessed surface surrounding the mesa on the front side of the template, a recessed surface coating on the recessed surface, a first frame window that is inset within the recessed surface coating and surrounds the mesa. The method may comprise contacting formable material in an imprint field on a substrate with the patterning surface. The method may further comprise after the patterning surface contacts the formable material, the formable material spreads under the patterning surface towards mesa sidewalls of the template. The method may further comprise exposing the formable material to a frame like illumination pattern of actinic radiation thru the frame window prior to the formable material reaching the mesa sidewalls. The method may further comprise the frame like illumination pattern of the actinic radiation increases the viscosity of the formable material. The method may further comprise exposing the formable material to a curing dose of the actinic radiation thru the patterning surface, forming a pattern of cured formable material. The method may further comprise separating the template from the cured formable material. The method may further comprise processing the substrate on which the pattern has been formed to manufacture the article.

In an aspect of the second embodiment, the frame like illumination pattern of the actinic radiation may bounce between the recessed surface coating and the substrate before being incident upon the formable material that is approaching the mesa sidewalls.

An aspect of the second embodiment, may further comprise exposing the formable material to the frame like illumination pattern of the actinic radiation using one or more optical components to guide the frame like illumination pattern of the actinic radiation from a radiation source that generates both the frame like illumination pattern of the actinic radiation and the curing dose of the actinic radiation thru both the template and the frame window. The method may further comprise exposing the formable material to the curing dose of the actinic radiation using the one or more optical components to guide the curing dose of the actinic radiation from the radiation source thru: the template and the patterning surface.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
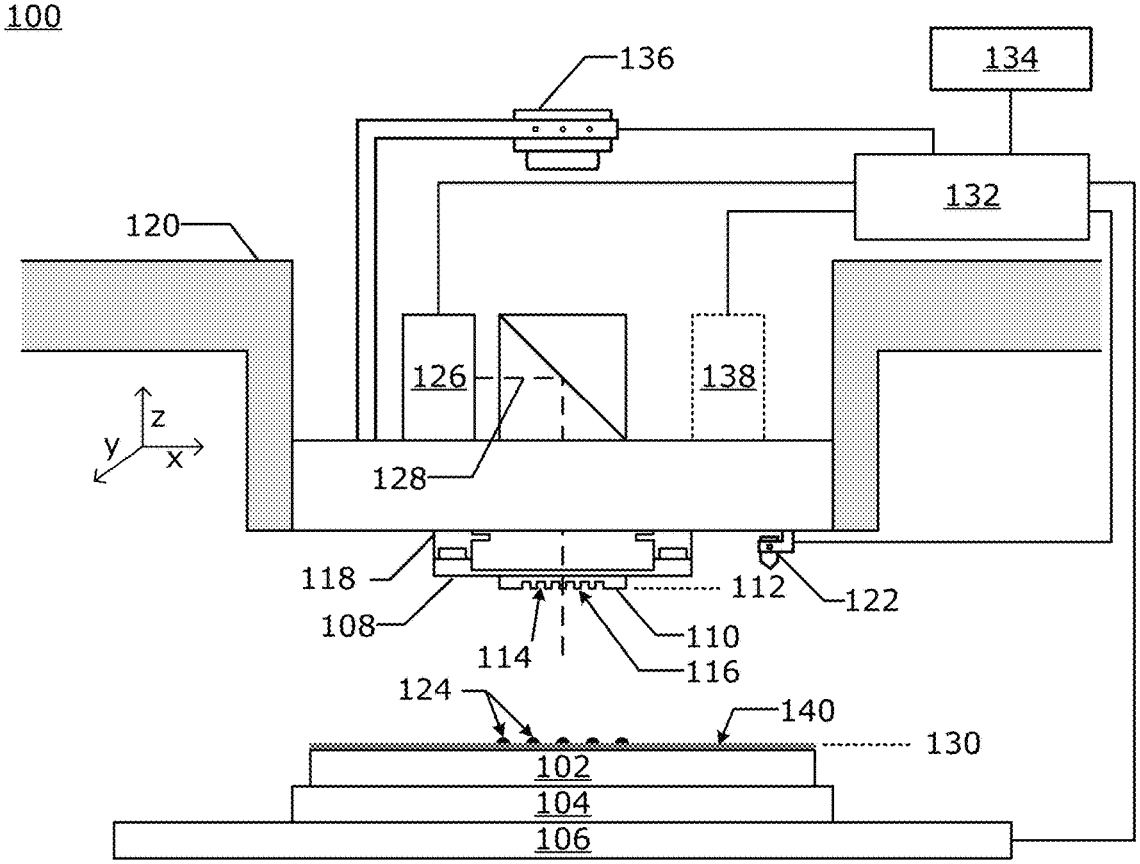
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

In the imprint process, extrusions can form when formable material extrudes beyond a sidewall of a mesa of a template during the imprinting process. The extruded formable material may cure and stay on the substrate or template after separation. Extrusions may be considered a defect especially when their height exceeds the feature size. What is need is a method of preventing extrusions from forming.

Nanoimprint System

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may comprise features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. A spread camera 136 may likewise be positioned such that an imaging field of the spread camera 136 is in superimposition with the exposure path 128. The spread camera 136 may be configured to detect the spread of formable material under the template 108.

The nanoimprint lithography system 100 may further comprise a droplet inspection system 138 that is separate from the spread camera 136. The droplet inspection system 138 may include one or more of a CCD, a camera, a line camera, a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

Prior to the formable material 124 being dispensed onto the substrate, a substrate coating 140 may be applied to the substrate 102. In an embodiment, the substrate coating 140 is an adhesion layer. In an embodiment, the substrate coating 140 is applied to the substrate 102 prior to the substrate being loaded onto the substrate chuck 104. In an alternative embodiment, the substrate coating 140 is applied to substrate 102 while the substrate 102 is on the substrate chuck 104. In an embodiment, the substrate coating 140 is applied by spin coating, dip coating, etc. In an embodiment, the substrate 102 is a semiconductor wafer. In another embodiment, the substrate 102 is a blank template (replica blank) that is used to create a daughter template after being imprinted.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the radiation source 126, the spread camera 136 and/or the droplet inspection system 138. The processor 132 may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an Internet connected non-transitory computer readable storage device.

Either the imprint head, the substrate positioning stage 106, or both varies a distance between the mold 110 and the substrate 102 to define a desired space (a bounded physical extent in three dimensions) that is filled with the formable material 124. For example, the imprint head may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprinting fields that are spread across the substrate surface 130. Each of the imprinting fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprinting field which is the same size as the substrate 102 or the area of the substrate 102 which is to be patterned with the mesa 110. In an alternative embodiment, the imprinting fields overlap. Some of the imprinting fields may be partial imprinting fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprinting field. The patterned layer may also include one or more features such as protrusions which extend above the residual layer having a thickness. These protrusions match the recesses 114 in the mesa 110.

Template

Figure 2:
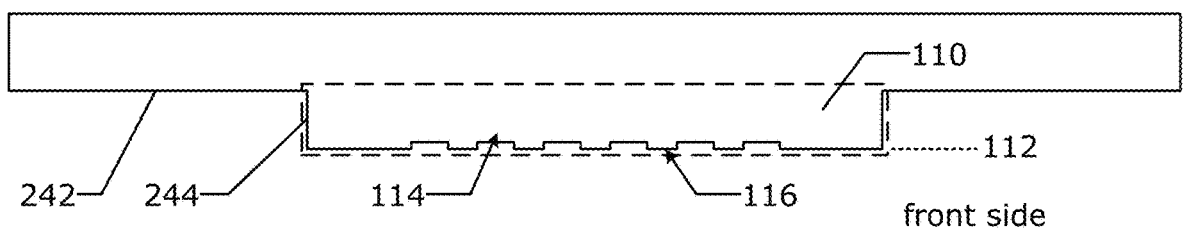
FIG. 2 is an illustration of an exemplary template that may be used in an embodiment.

FIG. 2 is an illustration of a template 108 that may be used in an embodiment. The patterning surface 112 is on a mesa 110 (identified by the dashed box in FIG. 2). The mesa 110 is surrounded by a recessed surface 242 on the front side of the template. Mesa sidewalls 244 connect the recessed surface 242 to patterning surface 112 of the mesa 110. The mesa sidewalls 244 surround the mesa 110. In an embodiment in which the mesa is round or has rounded corners, the mesa sidewalls refer to a single mesa sidewall that is a continuous wall without corners.

Extrusions

One of the issues that needs to be addressed during imprinting is preventing extrusions from forming on the mesa sidewalls 244. One method of addressing this issue is exposing the formable material 124 under the mesa 100 in a perimeter region to actinic radiation causing the formable material 124 in that perimeter region to partially cure (gel) or fully cure prior to the formable material 124 between the patterning surface 112 and the substrate 102 reaching the mesa sidewalls 244. One method of curing is to use a mesa shaped annular aperture of light that shines actinic radiation through the template 108 and onto the formable material 124 prior to or while a fluid front of formable material 124 approaches the mesa sidewalls 244. Thus, preventing the formable material 124 from reaching the mesa sidewalls 244, and preventing the formation of an extrusion.

Frame Curing

Figure 3:
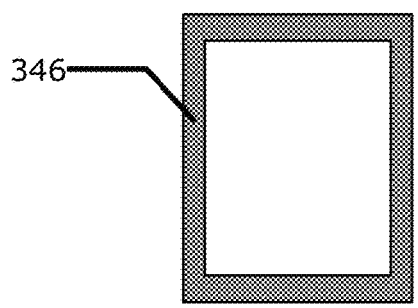
FIG. 3 is an illustration of an exemplary frame like illumination pattern that may be used in an embodiment.

The applicant has found that it is advantageous to expose the formable material 124 to actinic radiation with a frame like illumination pattern 346, as illustrated in FIG. 3, that exposes formable material 124 in a perimeter region under the mesa 110 with a gelling dose prior to curing the formable material 124 in a central region with a curing dose. System and methods for accomplishing this are described in U.S. patent application Ser. No. 15/837,898 filed on Dec. 11, 2017, which is hereby incorporated by reference (The applicant intends to correct this incorporation by reference under CFR 1.57(h) after this cited application publishes, which is projected to be on Jun. 13, 2018). In an alternative embodiment, the perimeter region 654 is exposed to a curing dose prior to curing the formable material 124 in the central region 652 with a curing dose of actinic radiation.

Figure 4:
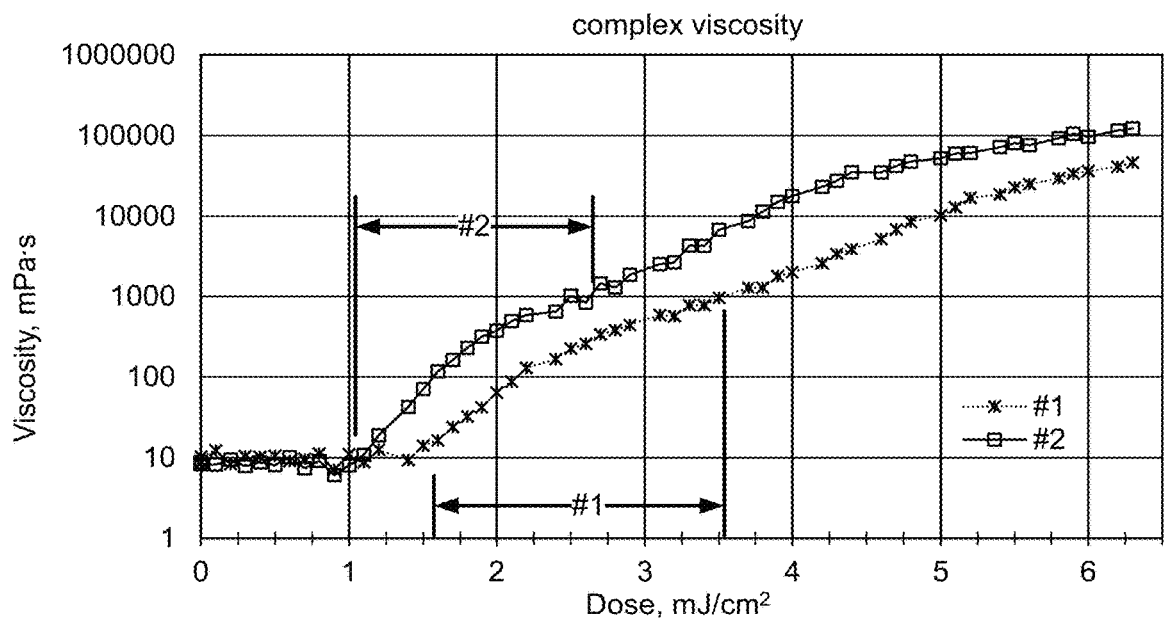
FIG. 4 is a chart illustrating viscosity data which is relevant to embodiments.

FIG. 4 is a chart illustrating viscosity data for two formable material formulations (#1 and #2) as a function of actinic radiation exposure dose. The applicant has determined that the appropriate actinic radiation dosage for these materials is indicated schematically by the corresponding ranges #1 and #2 as illustrated in FIG. 4. The original formable material viscosity for both materials is around 10 mPa·s prior to being exposed to actinic radiation. The applicant has determined that the ranges for appropriate actinic radiation dosage is one where the formable material viscosity changes from 1.1× or 10× to 100× of the original formable material viscosity (11 or 100 to 1000 mPa·s). The actinic radiation source may have a light intensity of 50 to 500 mW/cm². In order to produce an exposure dosage of 1.0 or 1.5-3.5 mJ/cm² which requires an exposure time in the range of ~2 or 3 msec to 70 msec. This exposure time provides a gelling dosage of actinic radiation which gels the formable material outside of the pattern region during a spreading phase but at the same time may not completely cure it. The gelling dosage is approximately 1% to 4% of the total actinic radiation dose required to completely cure the fluid. The gelling dosage is a dosage that falls within a first dose range. The lower limit of the first dose range is a dosage that is greater than an initiation dosage at which polymerization starts to occur, for example at approximately 1 mJ/cm². When the radiation is below the polymerization starting point other chemical reactions quench the polymerization reaction. The upper limit of the first dose range is a dose at which the fluid starts to turn into a solid, and interferes with alignment and the void elimination process. A second dose range is a curing dosage that is higher than first dose range and includes the total actinic radiation dose required to substantially solidify (cure) the fluid.

Table 1 below is an illustration of actinic radiation dose ranges and viscosity ranges that can be used in an exemplary embodiment for fluids #1 and #2. The thickening dosage is within the range in which a formable material becomes more viscous. The fluid can still move but the rate of spreading (velocity) significantly decreases.

TABLE 1

| Fluid | Thickening Dosage | Relative Viscosity increase | Viscosity range (mPa · s) |
|---|---|---|---|
| #1 | 1.4-3.5 mJ/cm² | 1.1x-100x | 11 to 1000 |
| #2 | 1-2.5 mJ/cm² | 1.1x-100x | 11 to 1000 |

The applicant has determined that the velocity at which the formable material spreads when it is sandwiched between a template 108 and a substrate 102 is approximately inversely proportional to the viscosity of the formable material. Thus increasing viscosity to a range of 1.1×, 1.5×, 2×, 5×, or 10× to 25×, 50× or 100× reduces a formable material flow rate (speed) and the flow rate down to 1% to 10% or 90% of the original values. For example, the viscosity may be increased, by approximately, 10%, 20%, 50%, 200%, 500%, 1000%, etc. The viscosity maybe increased such that extrusions are substantially eliminated. This can reduce the formation of extrusions as not only the formable material flows slower but the amount of formable material that flows out of the capillary slit (space between mesa 110 and substrate 102) is significantly reduced thus not allowing accumulation of any significant volume of formable material at the mesa sidewalls 244.

The radiation source 126 may include one or more components which generate the curing dose and the gelling dose of actinic radiation. The actinic radiation may be generated with: UV LED; fluorescent lamp; hollow cathode lamps, gas-discharge laser; etc. The radiation source 126 may include a light processor that modulates the intensity of the light in both space and time. Exemplary light processors are: digital mirror device (DMD); liquid crystal on silicon (LcoS); spatial light modulator (SLM); a liquid crystal device (LCD); one or more mechanical shutters, one or more reflectors, or any other device which can modulate the intensity of actinic radiation in both space and time in a controlled and variable manner. The light from the light processor may be guided by optical components through the template 108 and towards the formable material 124 on the substrate 102. In response to signals from the processor 132, the radiation source 126 may adjust the intensity and spatial distribution of the actinic radiation. In an alternative embodiment, the radiation source 126 may include one or more components that generates a curing dose with two different illumination patterns a mesa illumination pattern and a frame like distribution pattern. In an alternative embodiment, a first source may emit actinic radiation with a frame like illumination pattern and a second source may actinic radiation with mesa illumination pattern. In one embodiment, a radiation source may generate the actinic radiation that is emitted by the first source and the second source. In another embodiment, the second source and the first source may include independent radiation sources.

Figure 5:
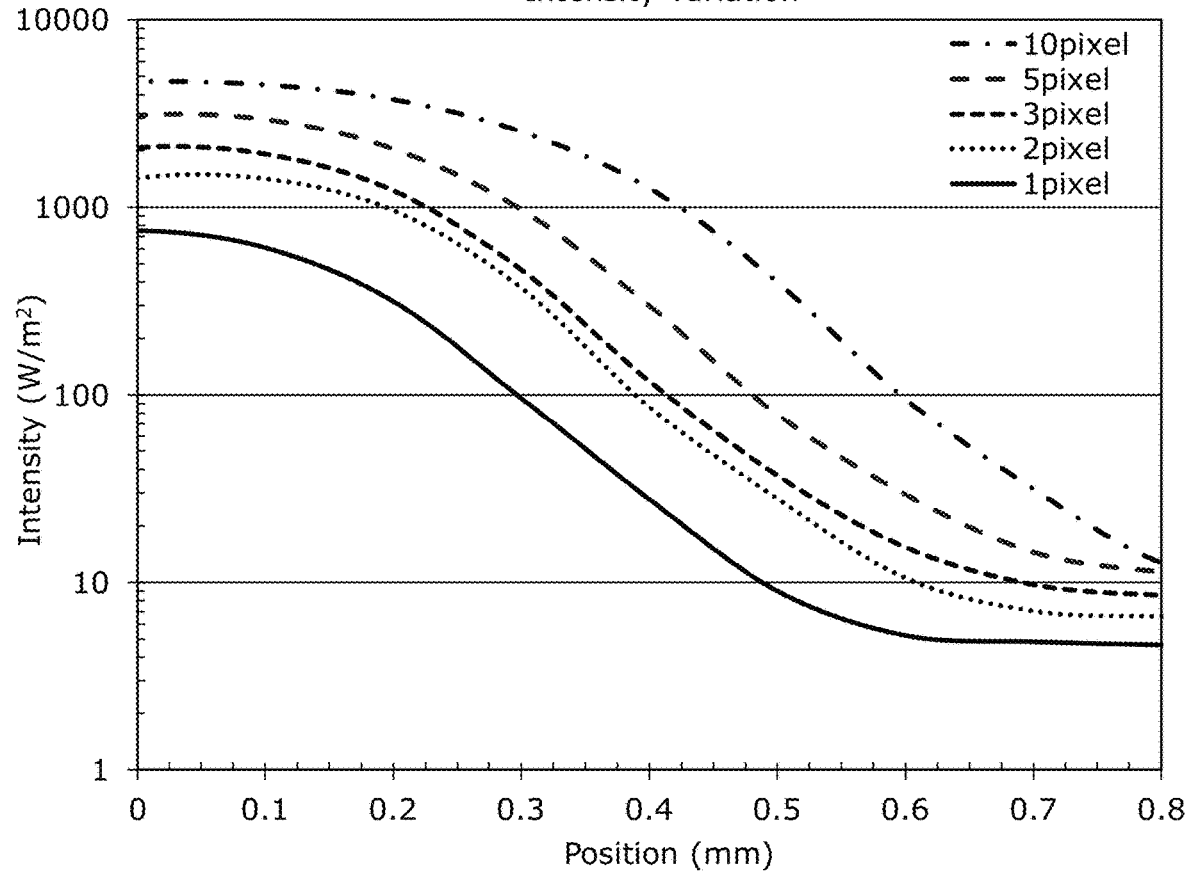
FIG. 5 is a chart illustrating intensity variation in a frame like illumination pattern which may be used in an embodiment.

FIG. 5 is a chart illustrating the intensity variation as a function of a position. The applicant has found that when a light processor such as digital mirror device is used to provide the frame like illumination pattern 346 which then passes through the template 108, that, it is difficult to create a frame like illumination pattern under the template 108 that has a sharp cutoff of the projected light. For example, FIG. 5 illustrates how the intensity varies in a cross section of a portion of the frame like illumination pattern 346 with various frame like illumination pattern widths.

Template for Improved Frame Curing

Figure 6A:
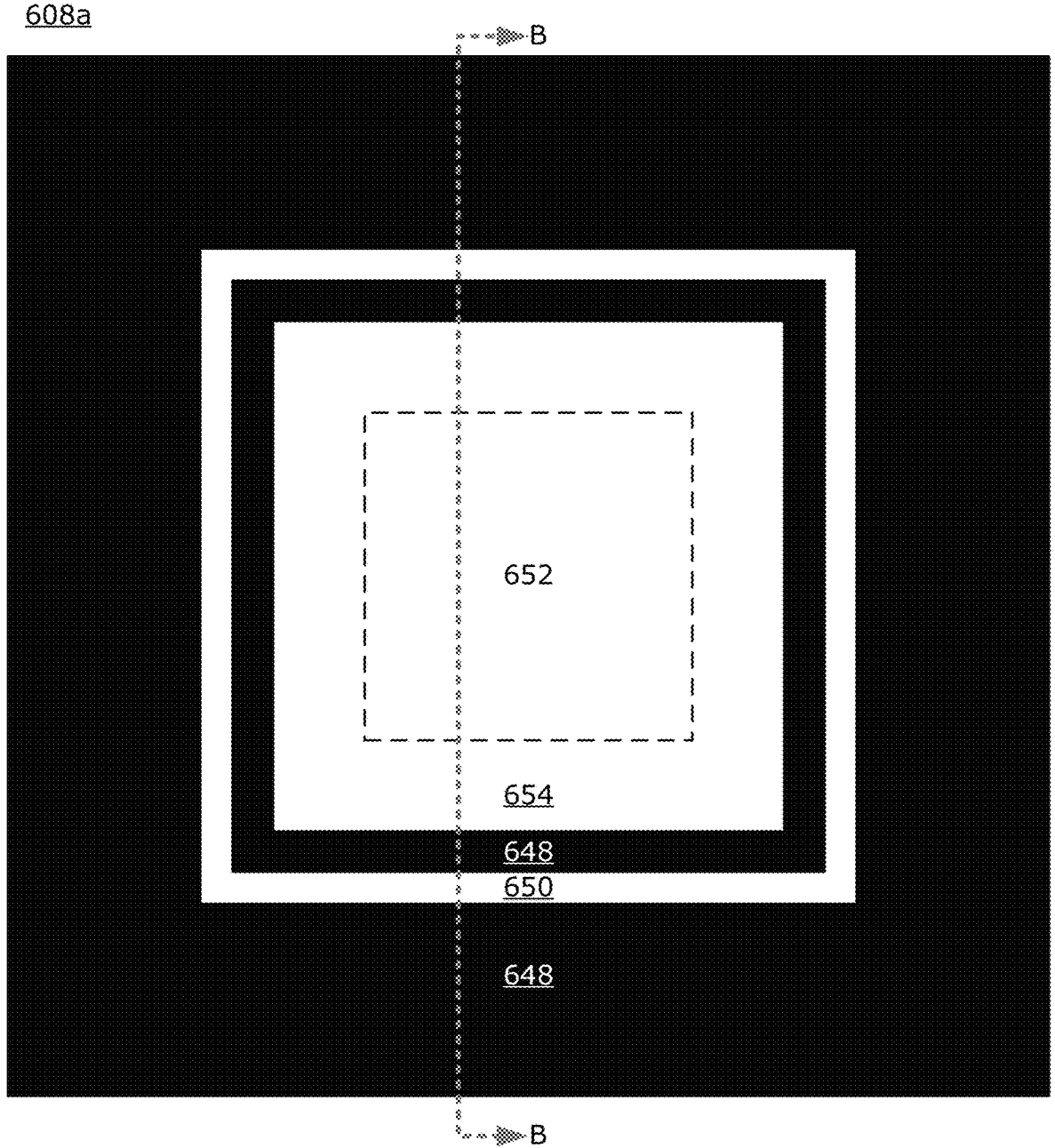
FIGS. 6A-M are illustrations of exemplary frame curing templates which are embodiments and also may be used in and/or by embodiments.
Figure 6B:
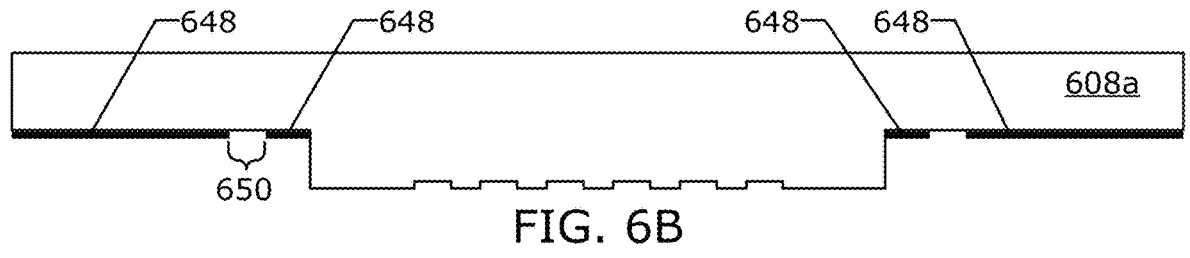

The applicant has developed a frame curing template 608a as illustrated in FIGS. 6A-B (not to scale) that may be used to prevent extrusions. The patterning surface 112 has a central region 652 and a perimeter region 654 surrounding the central region 652 as illustrated in FIG. 6A in a plan view. The width of the perimeter region may be 5 µm, 10 µm, 50 µm, 100 µm, 200 µm, or another width that provides sufficient fluid control or other purpose. In an embodiment, the central region 652 may include patterning features or may be planar. The perimeter region 654 may include fluid control features which help to prevent extrusions.

The frame curing template 608a also has a recessed surface coating 648 on the recessed surface 242 as illustrated in FIG. 6B which is a view along the cutting plane B illustrated in FIG. 6A. The recessed surface coating 648 may be a chromium film that has a thickness of 25 nm or greater. The recessed surface coating 648 may be made of a multilayer film, an elemental film (e.g. aluminum, gold, silver, chromium, etc.) a multi-element film (e.g. oxides, fluorides, etc.); a chromium thin film; the chromium thin film and a protective layer; an aluminum thin film; UV enhanced aluminum thin film; or a multilayer reflective film. The recessed surface coating 648 may be made of a material that reflects or absorbs the gelling dose of actinic radiation. The recessed surface coating 648 may have reflectance to the actinic radiation incident on the front side of the recessed surface coating 648 that is above a second threshold reflectance. The second threshold reflectance is ideally 100% but may be 99%, 90%, 80%, or 50%. The recessed surface coating 648 has a frame window 650 inset within the recessed surface coating 648 which allows the gelling dose of actinic radiation to pass through the template 608a. In an alternative embodiment, the frame like distribution of a gelling dose of actinic radiation is replaced with frame like distribution of a curing dose actinic radiation.

In an ideal embodiment, the transmittance of the frame window 650 to actinic radiation is 100%. In a real world embodiment, the transmittance of the frame window 650 to actinic radiation is less than 100% and is high enough to allow the actinic radiation which does pass though the frame window 650 to cure or gel the formable material 124 enough that the formable material 124 does not reach the mesa sidewalls 244 prior to separation of the template 108 from the substrate 102. The transmittance of the frame window 650 to actinic radiation may vary depending on the refractive index of the template, any residual recessed surface coating, the incident angle of the incident frame like distribution, the dispersion of the incident frame like distribution, an anti-reflection (AR) coating, and the gas adjacent to the frame window 650. The transmittance of the frame window 650 to actinic radiation may be greater than a first threshold transmittance. The average transmittance of the frame window 650 to the incident frame like distribution may be greater than 94%, 90%, 80%, 70%, 60%, etc. In an embodiment, the frame window has an AR coating, a thinner recessed surface coating, a bare surface of the template, and/or a protective coating.

In an ideal embodiment, the transmittance of the recessed surface coating 648 to actinic radiation is zero. The transmittance of the recessed surface coating 648 to actinic radiation may be greater than zero as long as the actinic radiation which does pass though is not high enough to cure or gel the formable material within the central region 652 of the patterning surface 112. For example, the transmittance of the recessed surface coating 648 to actinic radiation may be less than 0.1%, 1%, 5%, 10%, or 50% depending on the dosage of the frame like distribution pattern which is incident upon the template side of the recessed surface coating 648. The transmittance of the recessed surface coating 648 to actinic radiation may be less than the first threshold transmittance. The first threshold transmittance may be 0.1%, 1%, 5%, 10%, or 50% of the incident radiation as transmitted through the template from the back side of the template 108. The transmittance of the frame window 650 may also be 1000×, 100×, 50×, 10×, or 2× times the transmittance of the recessed surface coating 648.

Figure 6C:

FIG. 6C is an illustration of the central region 652 of the template 108 being positioned above an imprint field of a substrate 102 on which formable material 124 has been deposited.

Figure 6D:
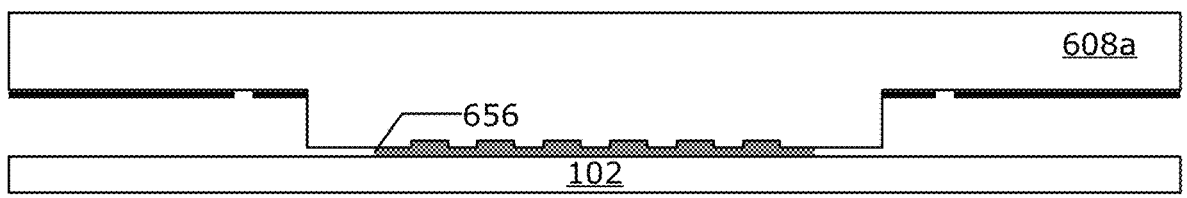
Figure 6E:
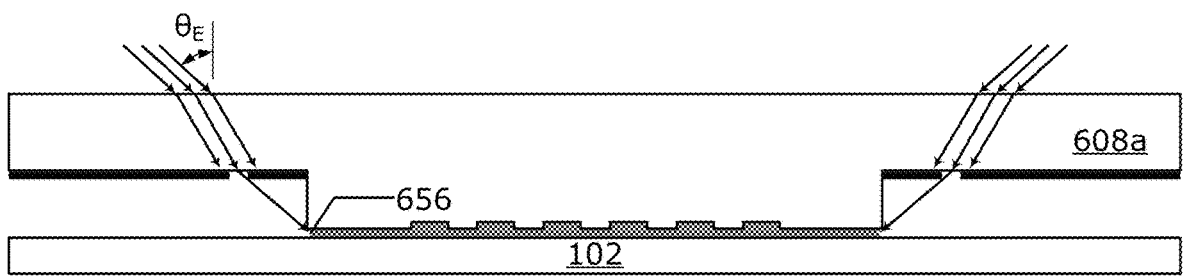

FIG. 6D is an illustration of the template 608a and the substrate 102 after the central region 652 of the template 108 has been brought into contact with the formable material 124 in the imprint field on the substrate 102. This causes the formable material 124 to spread due to capillary action and/or applied pressure. The spreading, creates a fluid front 656 of the formable material 124 that spread towards the perimeter region 654 and the mesa sidewalls 244. As the fluid front 656 spreads through the perimeter region 654 and prior to the fluid front 656 reaching the mesa sidewalls 244 the fluid front 656 is exposed to a gelling dose of actinic radiation as illustrated in FIG. 6E which passes through the frame window 650. The frame window 650 has a frame shaped aperture that is a spatial filter that allows the gelling dose of actinic radiation to reach the fluid front 656 while also limiting how much actinic radiation reaches the formable material in the central region 652.

The gelling dose of actinic radiation has a frame like illumination pattern 346 when it is incident upon the back surface of the template 608a. The frame like illumination pattern 346 may be produced by a digital light processor, a spatial light modulator, a digital micromirror array, a movable set of frame like apertures or mirrors, etc. The frame like illumination pattern 346 has an incident angle on the back surface of the template 608a, and a beam divergence such that a portion of the frame like illumination pattern 346 reaches the formable material 124 fluid front 656 prior to the fluid front 656 reaching the mesa sidewalls 244 that has an illumination beam frame edge θ. In an alternative embodiment, the fluid front 656 is exposed to a curing dose of the actinic radiation that has a frame like illumination pattern 346.

As illustrated in FIG. 6E a gelling dose of actinic radiation may be used to illuminate the fluid front 656 by exposing the template 108 to a frame like actinic radiation pattern with an inner illumination beam edge that has an angle $\theta_E$ such that the gelling dose of actinic radiation passes through the frame window 650 as the fluid front 656 passes through the perimeter region 654 such that the formable material 124 does not reach the mesa sidewalls 244, while at the same time not exposing the central region 652 of the template to the gelling dose of actinic radiation. The recessed surface coating 648 blocks some portion of the frame like illumination pattern 346 incident on the back surface of the template and provides an illumination pattern at the substrate that has a sharper cutoff than the illumination pattern incident on the back surface of the template. In an alternative embodiment, the gelling dose is a curing dose.

Figure 6F:
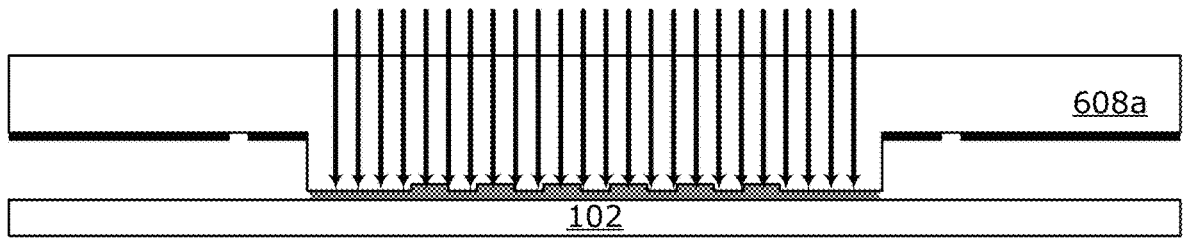

After the formable material 124 has spread and any gas under the template 608a has dissipated the formable material 124 may be exposed to a curing dose of the actinic radiation thru the patterning surface 112 as illustrated in FIG. 6F. The curing dose of the actinic radiation is a dose of actinic radiation that causes the formable material 124 to solidify to the point that the cured formable material maintains the shape of the patterning surface 112.

Figure 6G:
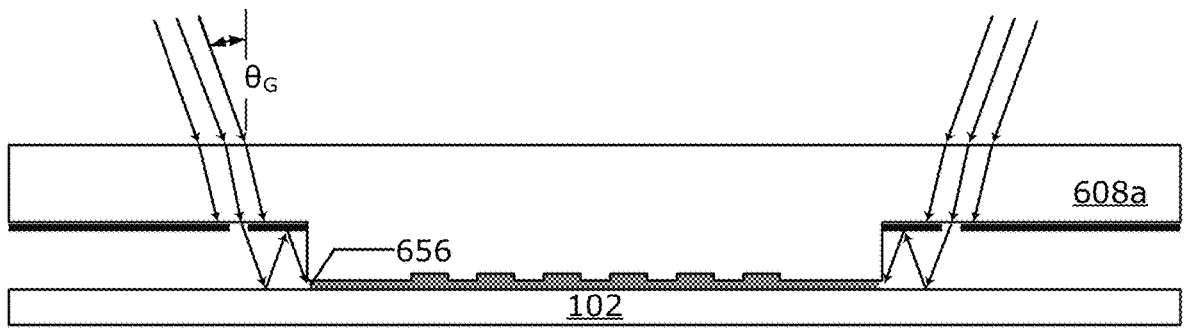

In an alternative embodiment, as illustrated in FIG. 6G, the recessed surface coating 648 is reflective and the gelling dose of actinic radiation passes through the frame window 650 reflects off the substrate 102, reflects off the recessed surface coating 648 again and is incident upon the formable material 124 while the formable material is in the perimeter region 654 and prior to reaching the mesa sidewalls 244. An advantage of the embodiment illustrated in FIG. 6G over the embodiment illustrated in FIG. 6E is that the inner illumination beam edge has angle $\theta_G$ at which the gelling dose of actinic radiation is incident on the back of the template is closer to perpendicular with the surface of the frame window then the angle of the gelling dose of actinic radiation exiting the frame window 650 can be less as in the embodiment illustrated in FIG. 6G than in the embodiment illustrated in FIG. 6E. Another advantage is that frame window 650 can be farther from the mesa sidewalls 244 and that the inner tail edge of the frame like gelling dose of actinic radiation does not reach the central region 652 of the mesa 110. In an alternative embodiment, a curing dose of the actinic radiation passes through the frame window instead of a gelling dose as described above.

Figure 6H:
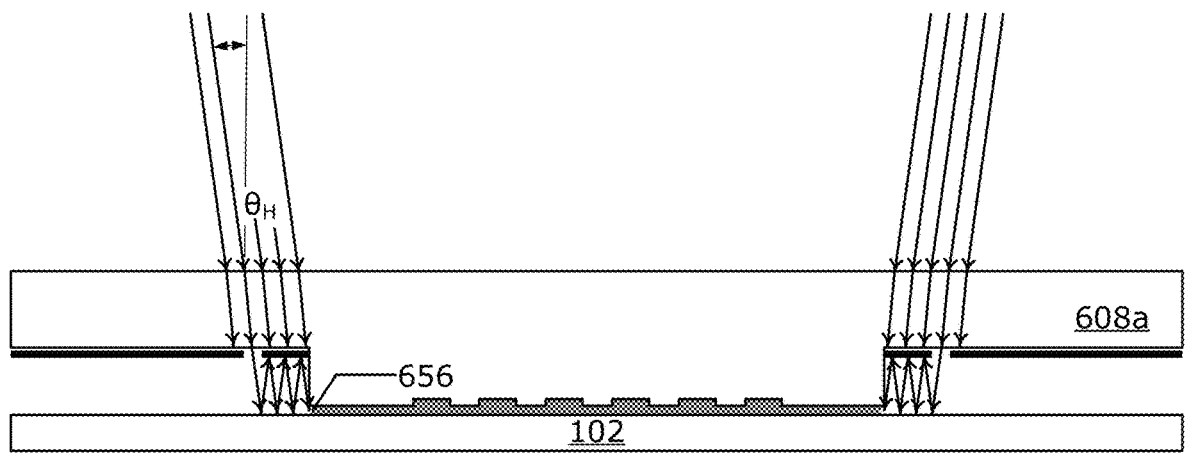

In an alternative embodiment, as illustrated in FIG. 6H the frame like distribution of actinic radiation passes through the frame window 650 and bounces multiple times between the recessed surface coating 648 and the substrate 102 before it reaches the formable material 124 at the mesa sidewalls 244.

In an embodiment only a limited area of the recessed surface 242 has the recessed surface coating 648, this allows portions of the radiation that pass thru the template 108 and to reflect off the substrate 102. While the formable material is spreading under the patterning surface 112 and filling any recesses 114 that exist, actinic radiation is exposed to portion of the template 108 outside of the mesa 110. Therefore, the actinic radiation passes through the frame window 650 and may bounce between the substrate 102 and the recessed surface coating 648 and finally expose the polymerizable material at the edge of imprinting field and/or pass through the mesa sidewalls 244.

This method may be used for solidifying or gelling the polymerizable material at the edge of the field. This method may be performed prior to curing the formable material under the mesa. In an alternative embodiment, the fluid front in the perimeter region 654 may be cured, partially solidified, or gelled by actinic radiation that passes through the frame window while curing radiation passes through the central region 652. After and/or while the formable material 124 is exposed to a gelling dose of actinic radiation the fluid front 656 will slow down due to an increase in the viscosity of the formable material 124. Increasing the viscosity of the formable material 124 close to the mesa sidewalls 244 is beneficial both for extrusion prevention and facilitating alignment of the template with the substrate in a timely manner.

Figure 6I:
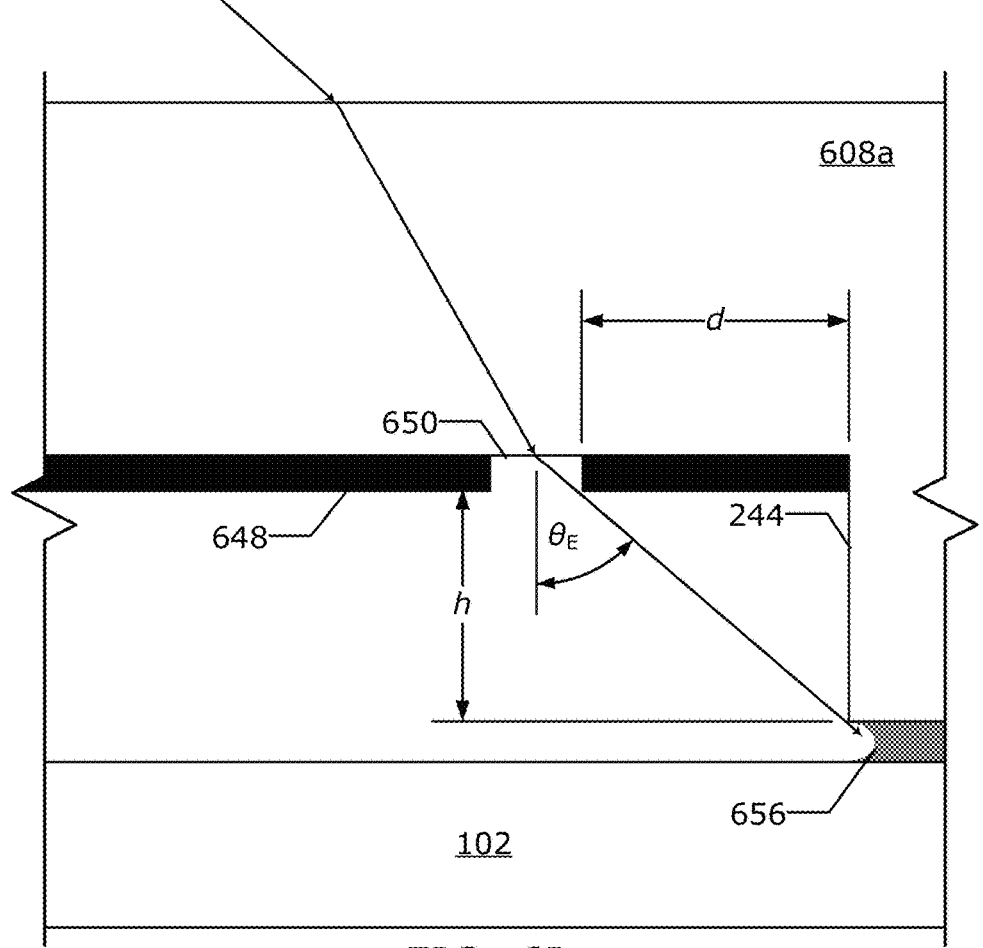

FIG. 6I is a zoomed in illustration of the embodiment illustrated in FIG. 6E. An edge of the frame window 650 closet to the mesa sidewall 244 is positioned a distance d from the mesa sidewall 240 such that an edge of the frame like illumination pattern of the gelling dose of actinic radiation exits the frame window at angle $\theta_E$ it reaches the fluid front 656 which is a height h below the recessed surface coating 648. In which the angle $\theta_E$ is a combination of the beam divergence and the incident angle.

Figure 6J:
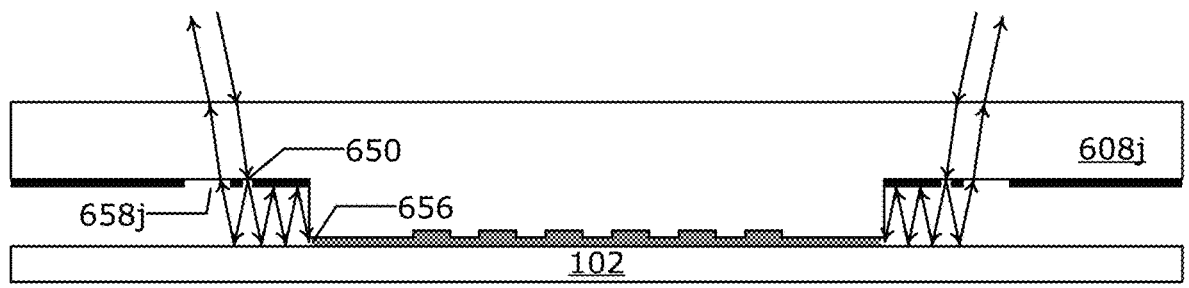
Figure 6K:
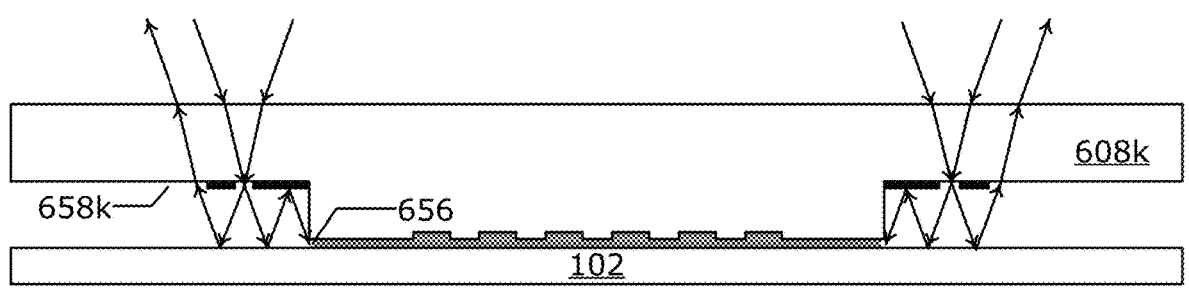

The applicant has found that actinic radiation can bounce and travel a few millimeters between a substrate 102 and the reflective recessed surface coating 648, while still having enough energy to cure or gel formable material that is in neighboring imprint fields. FIGS. 6J-K disclose embodiments which can address this issue and can prevent neighboring fields from being substantially exposed.

FIG. 6J illustrates a template 608j which is an exemplary embodiment of a template that includes both a frame window 650 and an outer frame window 658j. The outer frame window 658j may be positioned to allow actinic radiation that has been reflected off the substrate 102 and thru the template 108 thus preventing significant portions of adjacent fields from being exposed to the gelling dose (or curing dose) of actinic radiation. The outer frame window 658j may include an outer boundary which prevents randomly scattered actinic radiation from reaching adjacent fields.

FIG. 6K illustrates a template 608k which is an exemplary embodiment of a template that includes both a frame window 650 and an outer frame window 658k. The template 608k is substantially similar to template 608j except that outer frame window 658k does not include an outer boundary and extends toward the template edge as illustrate in FIG. 6K.

Figure 6L:
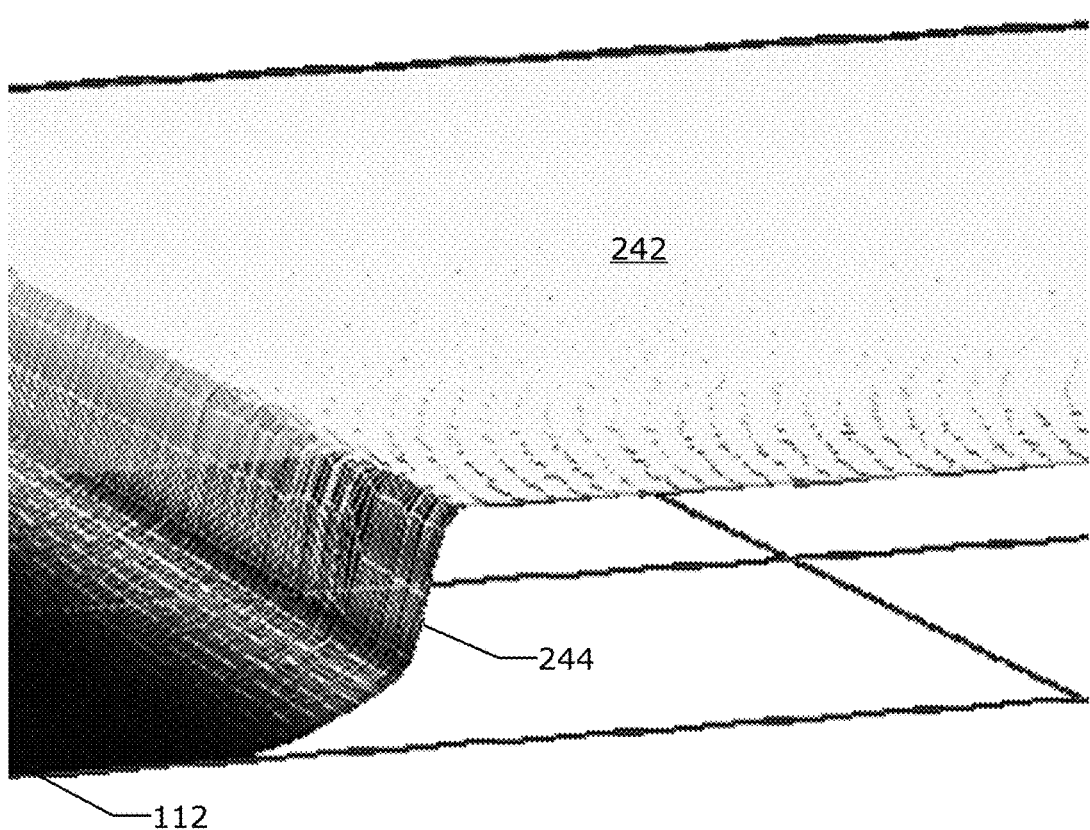

The templates described above are illustrated with mesa sidewalls 244 that are perpendicular to the patterning surface 112 and the recessed surface 242. In an alternative embodiment, the mesa sidewalls may have some angle and/or curvature as illustrated in FIG. 6L. FIG. 6L is a surface profile of a portion of a template as captured by a confocal microscope showing the recessed surface 242, the patterning surface 112, and the mesa sidewall 244 connecting them. The frame window 650 is positioned such that the actinic radiation is not reaches the formable material under the patterning surface at the edge of the template and may pass through the mesa sidewall to reach the formable material.

The frame like illumination pattern 346 as it reaches the mesa sidewall 244 may have an incident angle with the substrate 102 that may be around the angle of the mesa sidewall with the patterning surface 112. Wherein the incident angle is an angle at which the intensity of the frame like illumination pattern 346 gels (or in an alternative embodiment cures) the formable material.

Figure 6M:
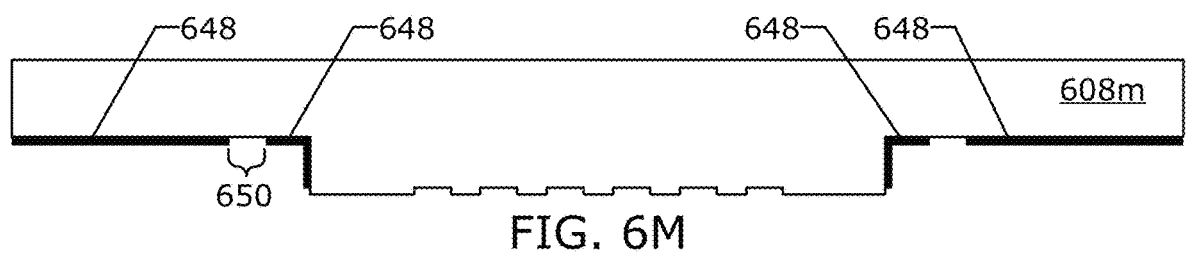

The template described above are illustrated with a recessed surface 242 that has a single plane and a recessed surface coating 648. In an alternative embodiment, the recessed surface is curved, has multiple planes, and/or steps. In an alternative embodiment, the recessed surface has a recessed surface coating which may absorb and/or reflect actinic radiation on one or more of the curved surfaces, planes, and/or steps. In an embodiment, the frame window and/or the outer frame window may intersect with changes in different planes. In an embodiment, as illustrated in FIG. 6M, a template 608m may have a recessed surface coating 648 that may cover a portion of the mesa sidewalls 244.

Template and Optical System for Improved Frame Curing

Figure 7A:
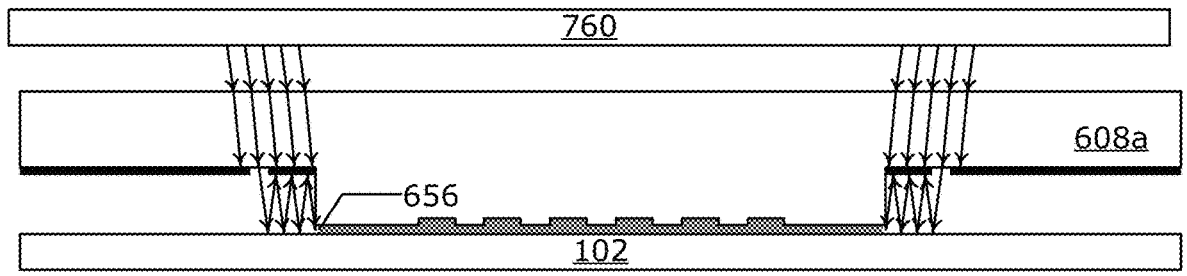
FIGS. 7A-G are illustrations of portions of exemplary nanoimprint systems using exemplary frame curing templates which may be embodiments.
Figure 7B:
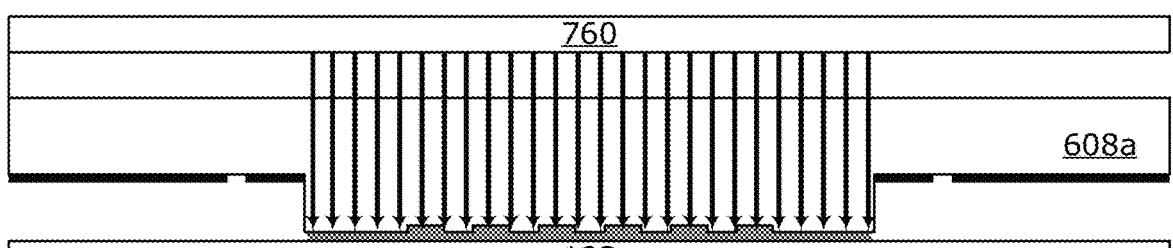

FIGS. 7A-B are illustrations of a portion of a nanoimprint system that include an optical system 760 which can output both a frame actinic radiation distribution and curing distribution. FIG. 7A illustrates how template 608a may be used in along with the optical system 760 to illuminate only the fluid front 656 when the optical system 760 is in a first state that produces the frame like illumination pattern 346. The frame like illumination pattern 346 does not expose the central region 652 to curing or gelling dosage of actinic radiation. FIG. 7B illustrates how template 608a may be used in along with the optical system 760 to cure the formable material 124 when the optical system 760 is in a second state that produces a curing illumination pattern which is used to cured the formable material under the patterning surface 112.

Figure 7C:
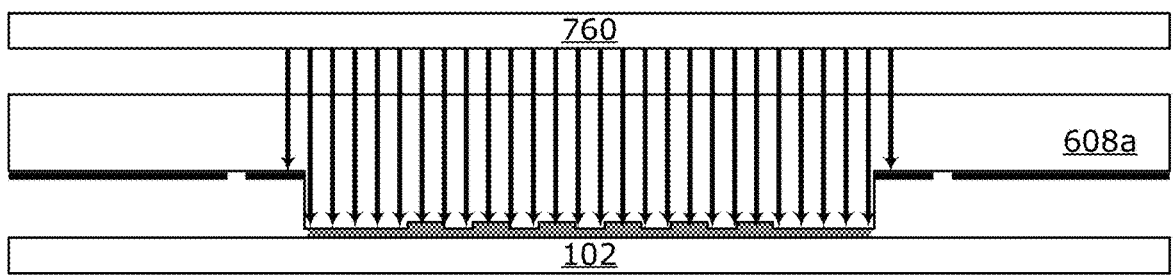

FIG. 7C is an illustration of a portion of the nanoimprint system that in which the recessed surface coating 648 blocks a portion of the curing illumination pattern.

Figure 7D:
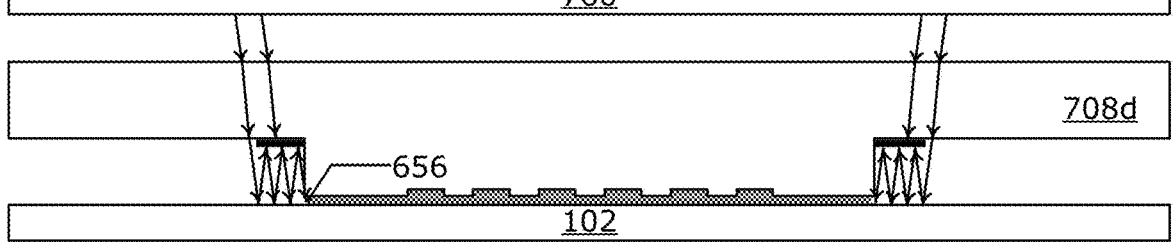

FIG. 7D is an illustration of a portion of the nanoimprint system that is substantially similar to the embodiment illustrated in FIG. 7A which uses a template 708d which has frame window 750 in which the outer boundary of the frame window 750 coincides with the template edge. In which case the optical system 760 will need to control outer edge of the frame like illumination pattern 346 to prevent unwanted gelling or premature curing of adjacent fields.

Figure 7E:
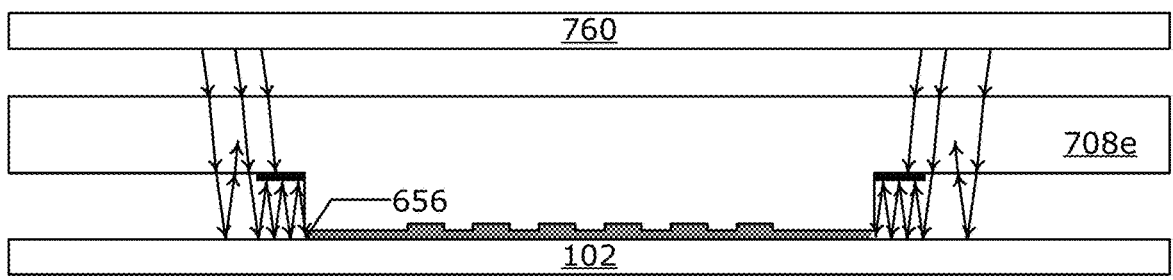

FIG. 7E is an illustration of a portion of the nanoimprint system that is substantially similar to the embodiment illustrated in FIG. 7D that is used in combination with a template 708e. In the embodiment illustrated in FIG. 7E, the frame like illumination pattern 346 has an outer edge which extends farther into the frame window, such that an unwanted portion of the actinic radiation reflected by the substrate 102 passes back through the frame window as illustrated in FIG. 7E and into the template 708e. After the unwanted portion passes into the template 708e the unwanted portion may pass through the template 708e, be reflected within, or be absorbed by a beam dump not shown.

Figure 7F:
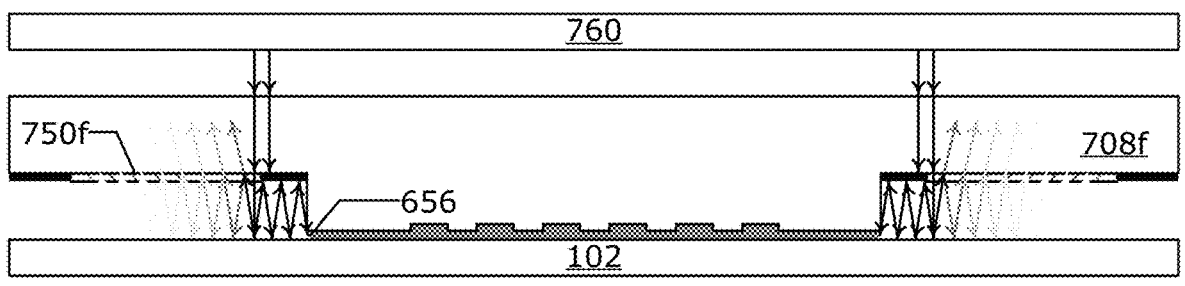

FIG. 7F is an illustration of a portion of the nanoimprint system that is substantially similar to the embodiment illustrated in FIG. 7D that is used in combination with a template 708f which has a frame window 650 that has an anti-reflection (AR) coating 750f within the frame window 650. As illustrated in FIG. 7F an unwanted portion of the actinic radiation is incident upon the AR coating 750f. The AR coating 750f will allow a significant portion of the unwanted actinic radiation to pass into the template 750f. Although the AR coating 750f improves the transmittance of the template 750f to unwanted actinic radiation, it is not perfect and some portion of that unwanted actinic radiation will be reflected back towards the substrate 102 which then passes back through the template 750f, This will happen repeatedly until the unwanted radiation is dissipated. Note that FIG. 7F was illustrated showing central incident ray that is perpendicular to substrate 102. The incident radiation has some divergence which is illustrated by the reflected light. In contrast, FIGS. 7A-E illustrated a paraxial ray that represents an edge of the divergent beam. In an embodiment, the frame window 650 has an outer boundary, the portion of the recessed surface 242 bounded by the outer edge of the AR coating 750f and the edge of the recessed surface may be coated with the recessed surface coating 650, which may be reflective.

Figure 7G:
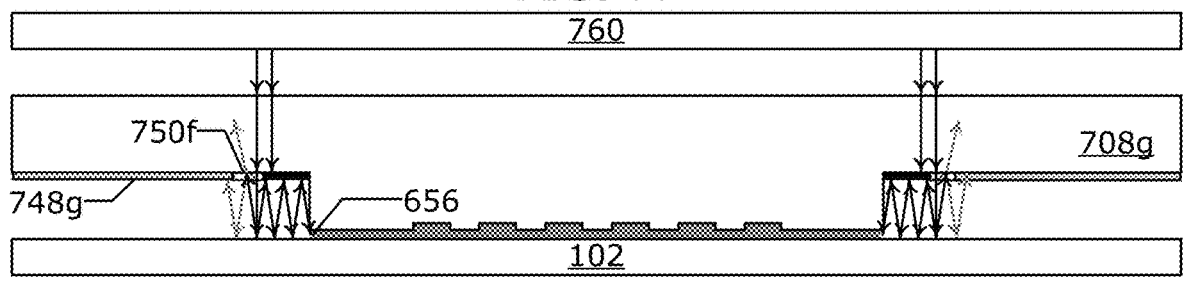

FIG. 7G is an illustration of a portion of the nanoimprint system that is substantially similar to the embodiment illustrated in FIG. 7F that is used in combination with a template 708g which has a frame window 650 that has an anti-reflection (AR) coating 750f within the frame window 650. The template 708g may also include an absorptive coating 748g that surrounds the frame window 650. The absorptive coating 748g may extend to the edge of the recessed surface. In an alternative embodiment, the absorptive coating 748g does not extend to the edge of the recessed surface.

The optical system 760 may be the radiation source 126 or may be optically coupled to the radiation source 126. FIGS. 7A-7G illustrate the output window of the optical system 760. The configuration of the optical system 760 which produces this distribution may include one or more components which generate the curing dose and the gelling dose of actinic radiation. The actinic radiation may be generated with one or more: UV LED; fluorescent lamp; gas-discharge laser; etc. The radiation source may include a light processor that modulates the intensity of the light in both space and time. Exemplary light processors are: digital mirror device (DMD); liquid crystal on silicon (LcoS); spatial light modulator (SLM); a liquid crystal device (LCD); one or more mechanical shutters, one or more reflectors, or any other device which can modulate the intensity of actinic radiation in both space and time in a controlled and variable manner. The light from the light processor may be guided by optical components through the template 108 and towards the formable material 124 on the substrate 102. In response to signals from the processor 132, the radiation source 126 may adjust the intensity and spatial distribution of the actinic radiation. The optical system may focus the frame like distribution pattern 346 on or near the recessed surface 242, the frame window 650, the substrate 102, the fluid front 656, or the recessed surface coating 648.

Imprinting Process

Figure 8:
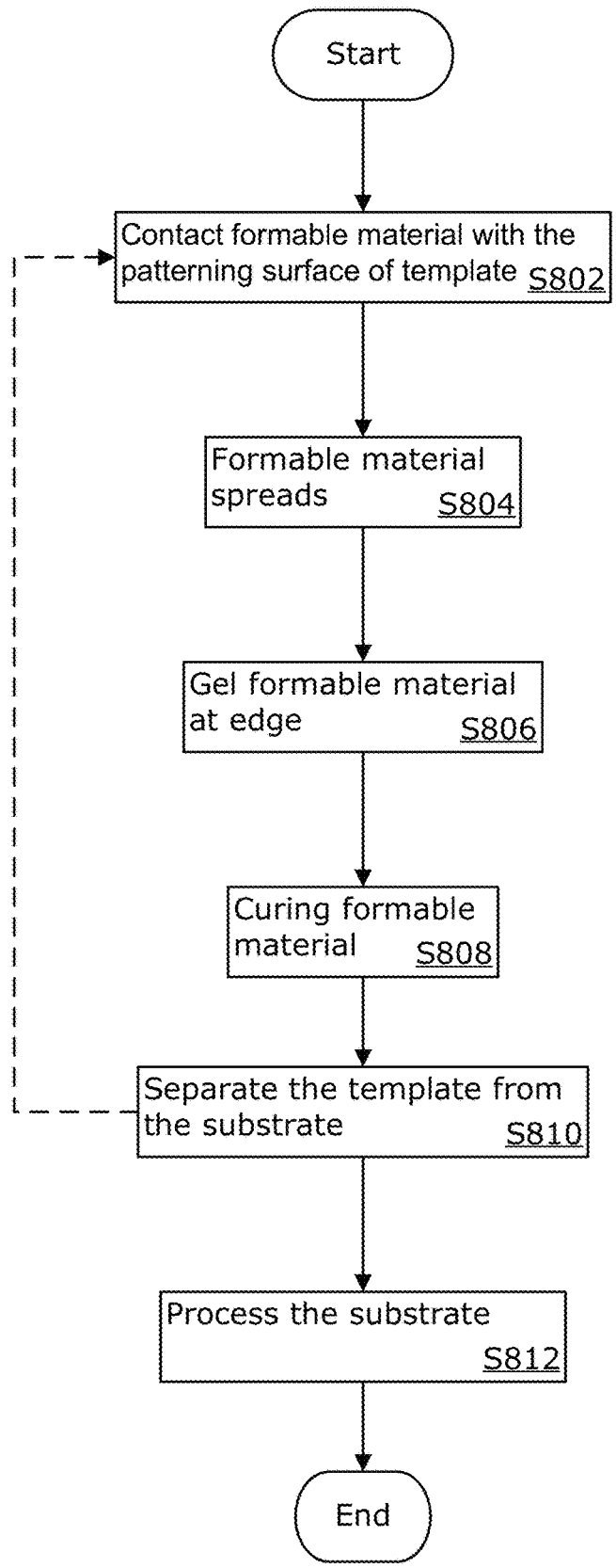
FIG. 8 is a flowchart illustrating an exemplary imprinting method as used in an embodiment.

FIG. 8 is a flowchart of an imprinting process 800 by the nanoimprint lithography system 100 that can be used to form patterns in formable material 124 on one or more imprint fields (also referred to as: pattern areas or shot areas). The imprinting process 800 may be performed repeatedly on a plurality of substrates 102 by the nanoimprint lithography system 100. The processor 132 may be used to control imprinting process 200.

The beginning of the imprinting process 800 may include a template mounting step causing a template conveyance mechanism to mount a template 108 onto the template chuck 118. The imprinting process may also include a substrate mounting step, the processor 132 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 132 may cause one or both of the substrate positioning stage 106 and a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc $\{N \in \mathbb{Z}^+\}$. In a dispensing step, the processor 132 may cause the fluid dispenser 122 to dispense formable material onto imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i.

After, the droplets are dispensed, then a contacting step S802 may be initiated, the processor 132 may cause one or both of the substrate positioning stage 106 and a template positioning stage to bring the patterning surface 112 of the template 108 into contact with the formable material 124 in imprinting field i.

During a spreading step S804, the formable material 124 then spreads out towards the edge of the imprinting field and the mesa sidewalls 244. The edge of the imprinting field may be defined by the mesa sidewalls 244. How the formable material 124 spreads and fills the mesa can be observed via the spread camera 136 and may be used to track a progress of the fluid front 656.

In a frame illumination step S806, while the fluid front 656 is advancing, the processor 132 may send instructions to the radiation source 126 and/or the optical system 760 to send a frame like illumination pattern 346 towards the frame window 650. Frame illumination step S806 may be performed at a specified time after contacting step S802 or after the fluid front 656 has spread to a specified extent as determined by the spread camera 136. The frame window 650 is an opening in a spatial filter on the recessed surface 242 of the template that is applied to the frame like illumination pattern 346 which is then incident upon the fluid front 656 prior to it reaching the mesa sidewalls. The frame like illumination pattern 346 that has been spatially filtered by frame window 650 may bounce between the substrate 102 and the recessed surface coating 648. The intensity of the filtered frame like illumination pattern 346 when it reaches the fluid front 656 may have an intensity that causes gelling but does not cause curing. In an alternative embodiment, the filtered frame like illumination pattern 346 does cause curing, but just of the formable material 124 close to the mesa side walls 244.

In a curing step S808, the processor 132 may send instructions to the radiation source 126 and/or the optical system 760 to send a curing illumination pattern of actinic radiation through the template 108, the mesa 110 and the patterning surface 112. The curing illumination pattern provides enough energy to cure (polymerize) the formable material 124 under the patterning surface 112. In an embodiment, the curing illumination pattern irradiates the formable material under the central region 652 and may also irradiate all or a portion of the perimeter region 654. In an embodiment, steps S806 and S808 may overlap.

In a separation step S810, the processor 132 uses one or both of the substrate positioning stage 106 and a template positioning stage to separate the patterning surface 112 of the template 108 from the cured formable material on the substrate 102.

If there are additional imprinting fields to be imprinted then the process moves back step S802. In an embodiment, additional processing is performed on the substrate 102 in a processing step S812 so as to create an article of manufacture (semiconductor device). In an embodiment, each imprinting field includes a plurality of devices.

The further processing in processing step S812 may include etching processes to transfer a relief image into the substrate that corresponds to the pattern in the patterned layer. The further processing in processing step S812 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An apparatus configured to imprint formable material in an imprint field onto a substrate with a template, the apparatus comprising:
   a template chuck configured to hold the template;
      wherein the template comprises:
      a patterning surface on a mesa on a front side of the template;
      a recessed surface surrounding the mesa on the front side of the template;
      a recessed surface coating on the recessed surface; and
      wherein a first transmittance from a back side of the template through the recessed surface coating to actinic radiation is below a first threshold;

a first frame window is inset within the recessed surface coating and surrounds the mesa;

wherein a second transmittance of the template from the back side of the template through the first frame window to the actinic radiation is above the first threshold;

a substrate chuck configured to hold the substrate;

a positioning system configured to bring the patterning surface into contact with the formable material in the imprint field of the substrate;

a first source positioned to emit a frame like illumination pattern of the actinic radiation exiting the first frame window at an angle into a region between the recessed surface and a surface adjacent to the imprint field of the substrate, and towards the patterning surface of the template held by the template chuck; and a second source configured to emit a curing dose of the actinic radiation that passes through the patterning surface of the template held by the template chuck.

2. The apparatus according to claim 1, wherein the first source is configured to emit a gelling dose of the actinic radiation to a perimeter region under the template, while limiting how much actinic radiation reaches the formable material in a central region of the template, such that the formable material in a perimeter region under the template gels in response to receiving the gelling dose of the actinic radiation that has passed through the first frame window.

3. The apparatus according to claim 1, wherein the first source is configured to emit a curing dose of the actinic radiation to a perimeter region under the template, while limiting how much actinic radiation reaches the formable material in a central region of the template, such that the formable material in a perimeter region under the template cures in response to receiving the curing dose of the actinic radiation that has passed through the first frame window.

4. The apparatus according to claim 1, further comprising:
a radiation source that generates the actinic radiation emitted by both the first source and the second source.

5. The apparatus according to claim 1, wherein the second source and the first source share one or more optical components for guiding both the frame like illumination pattern of the actinic radiation and the curing dose of the actinic radiation.

6. The apparatus according to claim 5, further comprising:
wherein the one or more optical components can be configured to be in a first state and a second state;
wherein in a first case in which the one or more optical components are in the first state, the frame like illumination pattern of the actinic radiation is:
guided thru the template;
guided thru the first frame window; and
incident upon the formable material in a gap between the substrate and a perimeter region of the patterning surface; and
wherein in a second case in which the one or more optical components are in the second state, the curing dose of the actinic radiation is guided thru: the template and the patterning surface.

7. The apparatus according to claim 1, wherein the actinic radiation exits the frame window at an angle that causes the actinic radiation to reach the formable material in a gap between the substrate and a perimeter region of the patterning surface and the angle also prevents the unwanted gelling or premature curing of neighboring fields surrounding the imprint field.

8. The apparatus according to claim 1, wherein:
a first portion of the frame like illumination pattern that passes through the first window is reflected by the substrate;
a second portion of the first portion is reflected off the recessed surface coating;
wherein the frame window is positioned relative to the mesa sidewall such that the second portion is incident on the formable material in a gap between the substrate and a perimeter region of the patterning surface, wherein the second portion of the first portion of the frame like illumination pattern is sufficient to cure or gel the formable material at in the gap between the substrate and the perimeter region of the pattern.

9. The apparatus according to claim 8, wherein the frame window is positioned relative to the mesa sidewall such that the frame like illumination pattern of actinic radiation is reflected more than once between the substrate and the recessed surface coating prior to being incident upon the formable material in the gap between the substrate and a perimeter region of the patterning surface.

10. The apparatus according to claim 8, wherein:
a third portion of the first portion that is reflected by the substrate is transmitted through a first section of the recessed surface that does not include the recessed surface coating.

11. The apparatus according to claim 8, wherein the first section is selected from a group consisting of: the frame window; and an outer frame window.

12. A method of manufacturing an article with an apparatus configured to imprint formable material in an imprint field onto a substrate with a template, the apparatus, comprising:
a template chuck configured to hold the template;
wherein the template comprises:
a patterning surface on a mesa on a front side of the template;
a recessed surface surrounding the mesa on the front side of the template;
a recessed surface coating on the recessed surface; and
wherein a first transmittance from a back side of the template through the recessed surface coating to actinic radiation is below a first threshold;
a first frame window is inset within the recessed surface coating and surrounds the mesa;
wherein a second transmittance of the template from the back side of the template through the first frame window to the actinic radiation is above the first threshold;
a substrate chuck configured to hold the substrate;
a positioning system configured to bring the patterning surface into contact with the formable material in the imprint field of the substrate;
a first source positioned to emit a frame like illumination pattern of the actinic radiation exiting the first frame window at an angle into a region between the recessed surface and a surface adjacent to the imprint field of the substrate, and towards the patterning surface of the template held by the template chuck; and
a second source configured to emit a curing dose of the actinic radiation that passes through the patterning surface of the template held by the template chuck;
the method of manufacturing the article comprising:
contacting the formable material in the imprint field on the substrate with the patterning surface;

wherein after the patterning surface contacts the formable material, the formable material spreads under the patterning surface towards mesa sidewalls of the template;

exposing the formable material to the frame like illumination pattern of actinic radiation thru the first frame window prior to the formable material reaching the mesa sidewalls;

wherein the frame like illumination pattern of the actinic radiation increases viscosity of the formable material;

exposing the formable material to the curing dose of the actinic radiation thru the patterning surface, forming a pattern of cured formable material;

separating the template from the cured formable material; and processing the substrate on which the pattern has been formed to manufacture the article.

13. The apparatus according to claim 1, wherein the first source is positioned to direct actinic radiation through the frame window such that unwanted gelling or premature curing of neighboring fields directly underneath the frame window due to the frame like illumination pattern of the actinic radiation is prevented.

14. The apparatus according to claim 1, wherein the first source is positioned to direct actinic radiation through the frame window such that the frame like illumination pattern of the actinic radiation gels or cures the formable material under the perimeter region of the patterning surface of the template while the template is held by the template chuck.

* * * * *